(12) United States Patent
Freitas et al.

(10) Patent No.: US 12,057,298 B2
(45) Date of Patent: Aug. 6, 2024

(54) APPARATUS FOR FIBER OPTIC TEMPERATURE PROBE IN PROCESSING CHAMBERS

(71) Applicant: Applied Materials, Inc., Santa Clara, CA (US)

(72) Inventors: Marcus Blake Freitas, San Ramon, CA (US); David Masayuki Ishikawa, Mountain View, CA (US); Vijay D. Parkhe, San Jose, CA (US); Visweswaren Sivaramakrishnan, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 372 days.

(21) Appl. No.: 17/684,903

(22) Filed: Mar. 2, 2022

(65) Prior Publication Data

US 2022/0285140 A1 Sep. 8, 2022

Related U.S. Application Data

(60) Provisional application No. 63/155,440, filed on Mar. 2, 2021.

(51) Int. Cl.
*H01J 37/32* (2006.01)
*G01K 1/14* (2021.01)
*G01K 11/32* (2021.01)

(52) U.S. Cl.
CPC .......... *H01J 37/32724* (2013.01); *G01K 1/14* (2013.01); *G01K 11/32* (2013.01)

(58) Field of Classification Search
CPC ........... H01J 37/32724; H01J 37/32715; H01J 37/32697; H01L 21/67103; H01L 21/6833; H01L 21/6831
See application file for complete search history.

(56) References Cited

U.S. PATENT DOCUMENTS

| 11,220,747 | B2 * | 1/2022 | AuBuchon | ........ H01L 21/67742 |
| 2002/0100282 | A1 * | 8/2002 | Flanigan | ........... H01L 21/67109 |
| | | | | 62/3.2 |
| 2018/0350561 | A1 * | 12/2018 | Yamaguchi | ......... H01L 21/6831 |
| 2019/0276936 | A1 * | 9/2019 | Kamata | ............ H01L 21/67248 |
| 2020/0393308 | A1 | 12/2020 | Ichihashi et al. | |
| 2022/0076919 | A1 * | 3/2022 | Paul | .................. H01L 21/68792 |
| 2022/0285140 | A1 * | 9/2022 | Freitas | ............... G01K 11/3213 |

FOREIGN PATENT DOCUMENTS

WO WO-2022187343 A1 * 9/2022 ............... G01K 1/14

* cited by examiner

*Primary Examiner* — Lee D Wilson
(74) *Attorney, Agent, or Firm* — Servilla Whitney LLC

(57) ABSTRACT

Apparatus and systems for temperature probe integration on pedestal heaters of a processing chamber including a cooling assembly for cooling temperature probes disposed within. Cooling assemblies can be actively water-cooled, passively cooled by fin stacks. Further cooling assemblies include a mechanical arm assembly for lowering or raising the temperature probes.

10 Claims, 7 Drawing Sheets

APPARATUS FOR FIBER OPTIC TEMPERATURE PROBE IN PROCESSING CHAMBERS

CROSS-REFERENCE TO RELATED APPLICATION

This application claims priority to U.S. Provisional Application No. 63/155,440, filed Mar. 2, 2021, the entire disclosure of which is hereby incorporated by reference herein.

TECHNICAL FIELD

Embodiments of the present disclosure generally relate to apparatus and systems for temperature probe integration on processing chambers. In particular, embodiments of the disclosure are directed to apparatus and systems for temperature probe integration on pedestal heaters of a processing chamber.

BACKGROUND

Many deposition processes benefit from maintaining a uniform temperature for a given deposition process. For example, in processes that involve cyclic oxidation and etching, the oxidation is performed at relatively high temperatures, and etching is performed at relatively low temperatures. In further examples, portions of the etch process may be performed at low temperatures and after etching, it may be desirable to raise the temperature to about 100° C. to sublimate compounds. To properly monitor temperatures within the processing chamber, stationary or retractable probes are often utilized. Stationary probes are subjected to both high temperatures which will degrade the probe and are subject to fluctuations in temperature which can affect the material properties of the probe. Retractable probes can cause variation in the processing volume which can cause variations in flow uniformity of gases across a substrate located within the processing volume. Temperature probes commonly made from fiber optic composites are limited to operation below 250 degrees. However chemical vapor deposition processes can reach above 500 degrees or even as high as 1000 degrees.

Therefore, there is a need in the art for apparatus and systems of integrated temperature probes capable of operating in higher temperatures without degrading.

SUMMARY

One or more embodiments of the disclosure are directed to substrate supports comprising a support top, a support bottom and an active heat transfer component. The support top has a support surface and a bottom surface that define a thickness of the support body. A thermal element is within the thickness of the support body. The support bottom has a top surface and a bottom surface defining a thickness of the support bottom. The top surface is positioned adjacent the bottom surface of the support top. At least one opening extends through the thickness of the support bottom. The at least one opening is configured to accept a temperature probe. The active heat transfer component comprises at least one conduit extending around an outer surface of the support bottom. The at least one conduit has an inlet end and an outlet end and configured to provide a flow of heat transfer fluid.

Additional embodiments of the disclosure are directed to substrate supports comprising: a support top having a support surface and a bottom surface defining a thickness of the support body, and a thermal element within the thickness of the support body; a support bottom having a top surface and a bottom surface defining a thickness of the support bottom, the top surface positioned adjacent the bottom surface of the support top, and at least one opening extending through the thickness of the support bottom, the at least one opening configured to accept a temperature probe; and a passive heat transfer component comprising at least one heat transfer fin extending along the at least one opening in the support bottom, the passive heat transfer component having a channel to allow the temperature probe to pass through the support bottom.

Further embodiments of the disclosure are directed to substrate supports comprising: a support top having a support surface and a bottom surface defining a thickness of the support body, and a thermal element within the thickness of the support body; a support bottom having a top surface and a bottom surface defining a thickness of the support bottom, the top surface positioned adjacent the bottom surface of the support top, and at least one opening extending through the thickness of the support bottom, the at least one opening configured to accept a temperature probe; and a sliding assembly comprising a base which slides rails in an upward or downward direction and a plurality of temperature probe protruding from the base.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
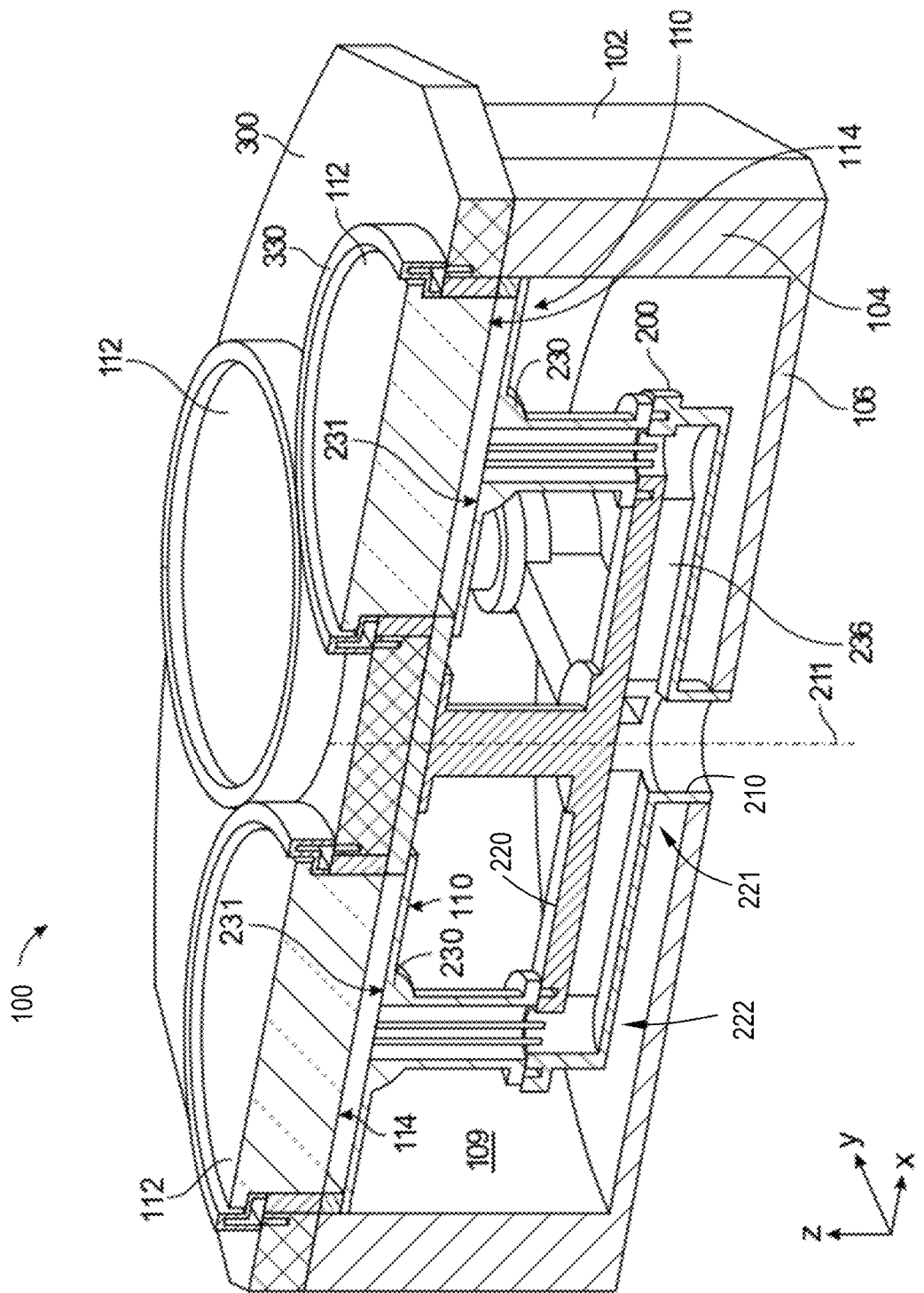
FIG. 1 shows a cross-sectional isometric view of a processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor substrates. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

Temperature compensation along a temperature probe is required to avoid undesired heat loss from high temperature platens at temperatures greater than 500 degrees.

Embodiments of the disclosure are directed to apparatus and systems for temperature probe integration on pedestal heaters of a processing chamber. Some embodiments provide a pedestal heater having a dedicated cooling assembly in which the temperature probes are disposed within for obtaining temperature measurements of the heater. Further embodiments provide for passive or active cooling of the temperature probes positioned within holes of the cooling assembly. Further embodiments provide for a temperature probe having a high temperature phosphor core which is actively or passively cooled at the base of the temperature probe and, in some embodiments, actively or passively heated at the mid-point of the probe. The phosphor ceramic core is intrinsically high temperature resistant and radio frequency ("RF") compatible. Embodiments providing for integration of the temperature probe with active or passive cooling and heating improves process stability and facilitates integration in processing chambers having high temperatures.

Figure 2:
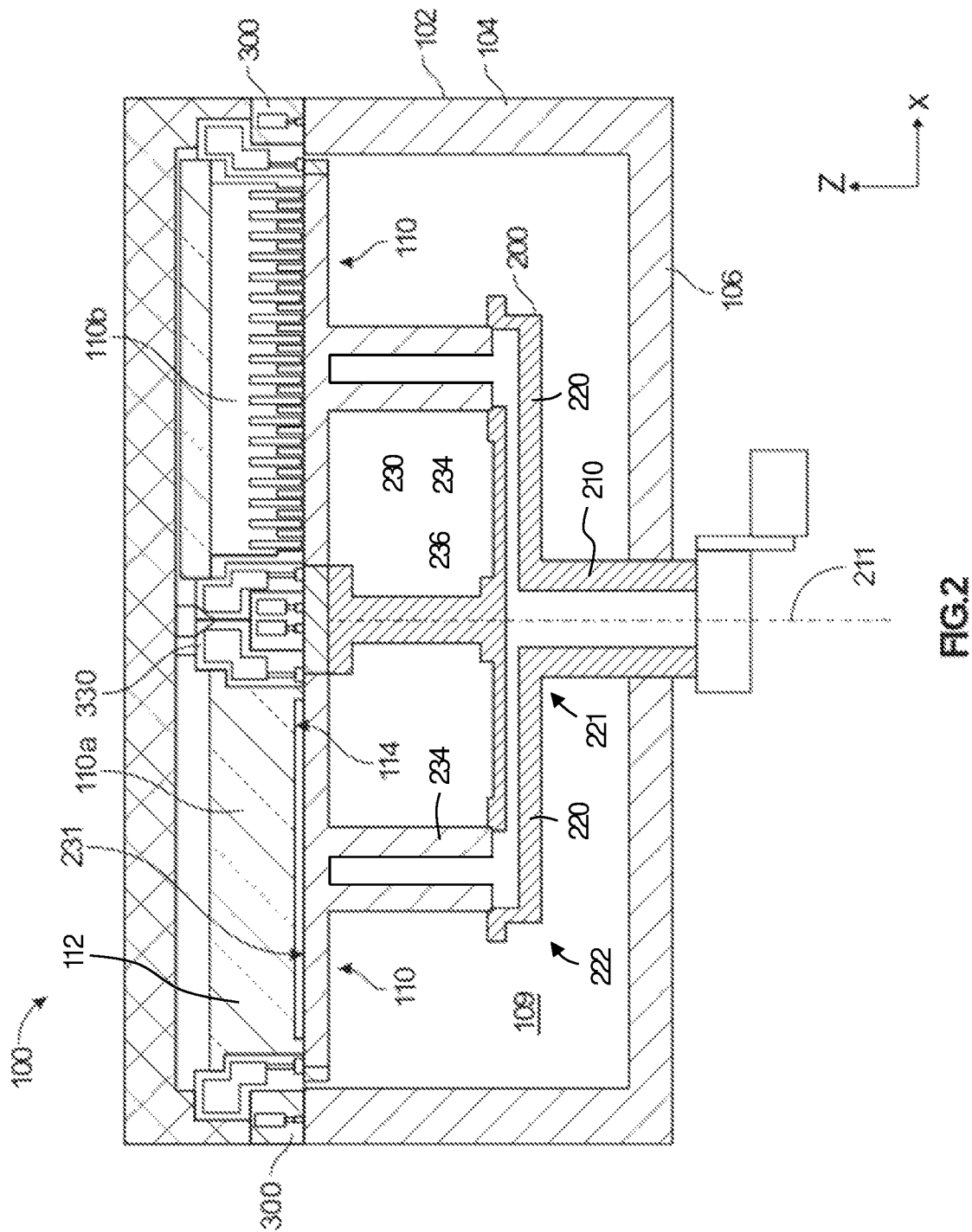
FIG. 2 shows a cross-sectional view of a processing chamber in accordance with one or more embodiment of the disclosure.

FIGS. 1 and 2 illustrate a batch processing chamber 100 in accordance with one or more embodiment of the disclosure. FIG. 1 shows the processing chamber 100 illustrated as a cross-sectional isometric view in accordance with one or more embodiment of the disclosure. FIG. 2 shows a processing chamber 100 in cross-section according to one or more embodiment of the disclosure.

The processing chamber 100 has a housing 102 with walls 104 and a bottom 106. The housing 102 along with the top plate 300 define an interior volume 109, also referred to as a processing volume.

The processing chamber 100 illustrated includes a plurality of processing stations 110. The processing stations 110 are located in the interior volume 109 of the housing 102 and are positioned in a circular arrangement around the rotational axis 211 of the support assembly 200. Each processing station 110 comprises a gas injector 112 (also referred to as a gas distribution plate) having a front surface 114. The processing stations 110 are defined as a region in which processing can occur. For example, in some embodiments, a processing station 110 is defined as a region bounded by the support surface 231 of the support assembly 200, as described below, and the front surface 114 of the gas injectors 112. In the illustrated embodiment, heaters 230 act as the substrate support surfaces and form part of the support assembly 200.

The processing stations 110 can be configured to perform any suitable process and provide any suitable process conditions. The type of gas injector 112 used will depend on, for example, the type of process being performed and the type of showerhead or gas injector. For example, a processing station 110 configured to operate as an atomic layer deposition apparatus may have a showerhead or vortex type gas injector. Whereas, a processing station 110 configured to operate as a plasma station may have one or more electrode and/or grounded plate configuration to generate a plasma while allowing a plasma gas to flow toward the substrate. The embodiment illustrated in FIG. 2 has a different type of processing station 110 on the left side (processing station 110a) of the drawing than on the right side (processing station 110b) of the drawing. Suitable processing stations 110 include, but are not limited to, thermal processing stations, microwave plasma, three-electrode CCP, ICP, parallel plate CCP, UV exposure, laser processing, pumping chambers, annealing stations and metrology stations.

Figure 3:
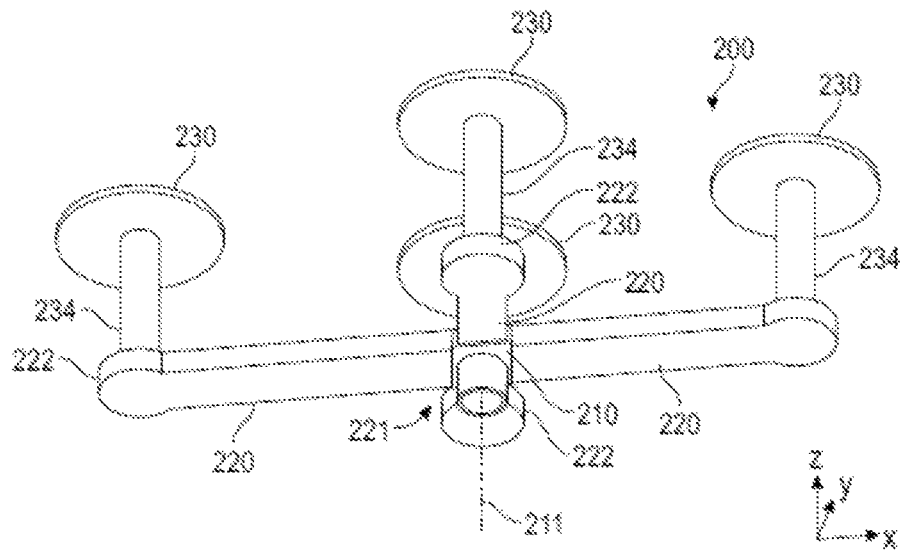
FIG. 3 is a bottom isometric view of a support assembly in accordance with one or more embodiment of the disclosure.
Figure 4:
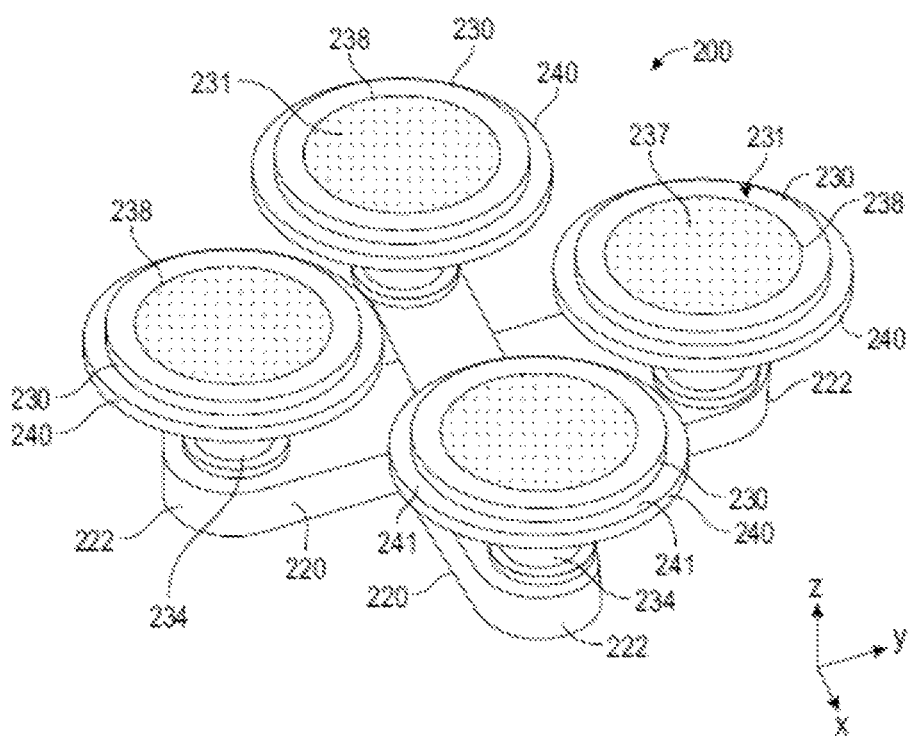
FIG. 4 is a top isometric view of a support assembly in accordance with one or more embodiment of the disclosure.
Figure 5:
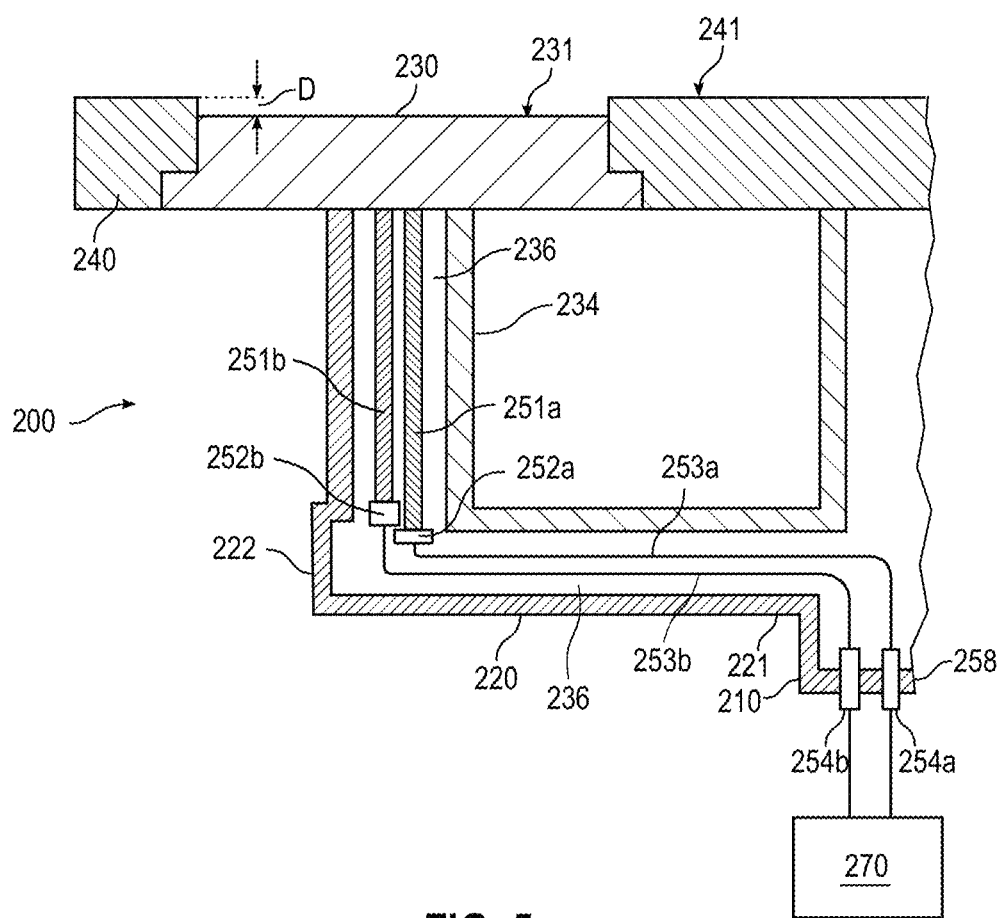
FIG. 5 is a partial cross-sectional schematic view of a support assembly in accordance with one or more embodiment of the disclosure.

FIGS. 3 through 5 illustrate support assemblies 200 in accordance with one or more embodiments of the disclosure. The support assembly 200 includes a rotatable center base 210. The rotatable center base 210 can have a symmetrical or asymmetrical shape and defines a rotational axis 211. The rotational axis 211, as can be seen in FIGS. 1 through 3, extends in a first direction. The first direction may be referred to as the vertical direction or along the z-axis. The use of the term "vertical" is not limited to a direction parallel to the pull of gravity, and the use of the term "horizontal" is not limited to a direction normal to the pull of gravity.

The support assembly 200 includes at least two support arms 220 connected to and extending from the center base 210. The support arms 220 have an inner end 221 and an outer end 222. The inner end 221 is in contact with the center base 210 so that when the center base 210 rotates around the rotational axis 211, the support arms 220 rotate as well. In some embodiments, the support arms 220 extend orthogonal to the rotational axis 211 so that the outer ends 222 are further from the rotational axis 211 than the inner ends 221 of the same support arm 220.

The support arms 220 can be connected to the center base 210 by any suitable manner known to the skilled artisan. For example, in some embodiments, the inner end 221 is connected to the center base 210 by use of fasteners (e.g., bolts). In some embodiments, the inner end 221 is integrally formed with the center base 210.

A heater 230 is positioned at the outer end 222 of the support arms 220. In some embodiments, each support arm 220 has a heater 230. The center of the heaters 230 are located at a distance from the rotational axis 211 so that upon rotation of the center base 210 around rotation axis 211, the heaters 230 move in a circular path around rotation axis 211.

The heaters 230 have a support surface 231 configured to support a substrate or wafer. In some embodiments, the heater 230 support surfaces 231 are substantially coplanar. As used in this manner, "substantially coplanar" means that the planes formed by the individual support surfaces 231 are within ±5°, ±4°, ±3°, ±2° or +1° of the planes formed by the other support surfaces 231.

In some embodiments, the heaters 230 are positioned directly on the outer end 222 of the support arms 220. In some embodiments, as illustrated in the drawings, the heaters 230 are elevated above the outer end 222 of the support arms 220 by a heater standoff 234. The heater standoffs 234 can be any size and length to increase the height of the heaters 230. The term "pedestal" is used to refer to a heater standoff 234 with a support surface 231 connected to the top end of the standoff. The support surface 231 can be part of the heater 230 or part of a different component without a heating element.

In some embodiments, a channel 236 is formed in one or more of the center base 210, the support arms 220 and/or the heater standoffs 234. The channel 236 can be used to route electrical connections for the heaters 230, electrical connections for an electrostatic chuck or to provide a gas flow.

The heaters 230 can be any suitable type of heater known to the skilled artisan. In some embodiments, the heater 230 is a resistive heater with one or more heating elements within a heater body.

The heaters 230 of some embodiments include additional components. For example, the heaters may comprise an electrostatic chuck. The electrostatic chuck can include various wires and electrodes so that a wafer positioned on the heater support surface 231 can be held in place while the heater is moved. This allows a wafer to be chucked onto a heater at the beginning of a process and remain in that same position on that same heater while moving to different process regions. In some embodiments, the wires and electrodes are routed through the channels 236 in the support arms 220. FIG. 5 shows an expanded view of a portion of a support assembly 200 in which the channel 236 is shown. The channel 236 extends along the support arm 220 and the heater standoff 234. A first electrode 251a and second electrode 251b are in electrical communication with heater 230, or with a component inside heater 230 (e.g., a resistive wire or an electrostatic chuck). In the illustrated embodiment, a first wire 253a connects to first electrode 251a at first connector 252a; and a second wire 253b connects to second electrode 251b at second connector 252b. In some embodiments, there are more than two wires. For example, in an example embodiment with a heating element and an electrostatic chuck, at least two wires are in contact with the heating element and at least two wires are in contact with the electrostatic chuck.

The wires can be routed through the support arms 220 and the support assembly 200 to connect with a power source (not shown). In some embodiments, the connection to the power source allows continuous rotation of the support assembly 200 without tangling or breaking the wires 253a, 253b. In some embodiments, as shown in FIG. 5, the first wire 253a and second wire 253b extend along the channel 236 of the support arm 220 to the center base 210. In the center base 210 the first wire 253a connects with center first connector 254a and the second wire 253b connects with center second connector 254b. The center connectors 254a, 254b can be part of a connection plate 258 so that power or electronic signals can pass through center connectors 254a, 254b. In the illustrated embodiment, the support assembly 200 can rotate continuously without twisting or breaking wires because the wires terminate in the center base 210. In some embodiments, the support assembly 200 is configured to allow rotation up to about 360° without twisting or breaking wires. A second connection is on the opposite side of the connection plate 258 (outside of the processing chamber).

In some embodiments, the wires are connected directly or indirectly to a power supply 270 or electrical component outside of the processing chamber through the channel 236. In embodiments of this sort, the wires have sufficient slack to allow the support assembly 200 to be rotated a limited amount without twisting or breaking the wires. In some embodiments, the support assembly 200 is rotated less than or equal to about 1080°, 990°, 720°, 630°, 360° or 270° before the direction of rotation is reversed. This allows the heaters 230 to be rotated through each of the stations 110 without breaking the wires.

Referring to FIG. 4, the heater 230 and support surface 231 can include one or more gas outlets (or openings 237) to provide a flow of backside gas. The backside gas may assist in the removal of the wafer from the support surface 231 or allow for other processes to occur, as described below. As shown in FIG. 4, the support surface 231 includes a plurality of openings 237 and a gas channel 238. The openings 237 and/or gas channel 238 can be in fluid communication with one or more of a vacuum source or a gas source (e.g., a purge gas or reactive gas). In embodiments of this sort, a gas line can be included to allow fluid communication of a gas source with the openings 237 and/or gas channel 238.

As explained in further detail below, a temperature measuring device (e.g., pyrometer, thermistor, thermocouple) is positioned against the support surface to measure one or more of the heater 230 temperature or the temperature of a substrate on the heater 230. In some embodiments, the control and/or measurement wires for the temperature measurement device are routed through the channel 236. Suitable temperature measurement devices are known to the skilled artisan and include, but are not limited to, optical pyrometers and contact thermocouples. In some embodiments, the temperature measuring device is a temperature probe 900 (as shown in FIG. 6).

FIGS. 6 through 9B illustrate a substrate support 500 having a active heat transfer component 600 for effectuating integration of a one or more temperature probes 900 to the substrate support 500 in accordance with one or more embodiments of the disclosure. However, the skilled artisan will recognize that the pedestal illustrated in FIGS. 6 through 9B are equivalent to the pedestals (the standoffs 234 and heater 230) shown in FIGS. 1 through 5. The embodiments illustrated in FIGS. 6 through 9B are merely representative of possible configurations and should not be taken as limiting the scope of the disclosure.

Figure 6:
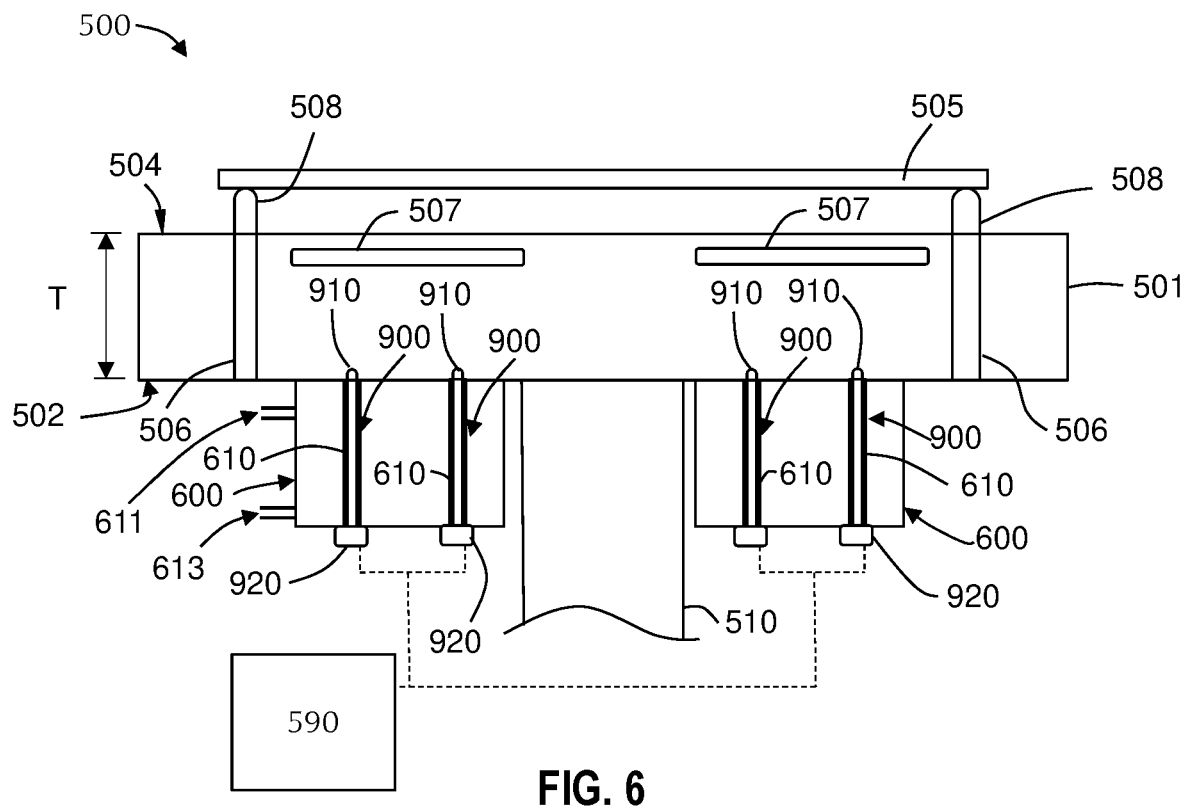
FIG. 6 is a cross-sectional schematic view of a substrate support according to one or more embodiment of the disclosure.

As shown in FIG. 6, the substrate support 500 comprises support top having a bottom surface 502 and a substrate support surface 504 opposite the bottom surface defining a thickness T of the support body. The support top further comprises one or more thermal elements 507 within the thickness of the substrate support 500. A substrate 505 is positioned over the substrate support 500 and can be lifted by a plurality of lift pins 508 extending through lift pin openings 506 of the support top 501. The substrate support further comprises a heater standoff 510 through which electrical or control wires are passed through in accordance with previously described embodiments. To monitor temperature of the substrate support 500, the substrate support 500 further comprises an active heat transfer component 600 disposed against the bottom surface 502 of the substrate support 500. In some embodiments, the active heat transfer component 600 has a cylindrical body casing with a central hole through which the heater standoff 510 passes through. In some embodiments, the active heat transfer component 600 is a single, isolated assembly disposed on the bottom surface 502 of the substrate support 500. In some embodiments, there are multiple probe heat transfer components 600. In some embodiments, the heat transfer component 600 includes an inlet 611 end and an outlet end 613 configured to provide of flow of heat transfer fluid. In some embodiments, the heat transfer fluid is water. In some embodiments, the heat transfer fluid is a coolant.

Figure 7:
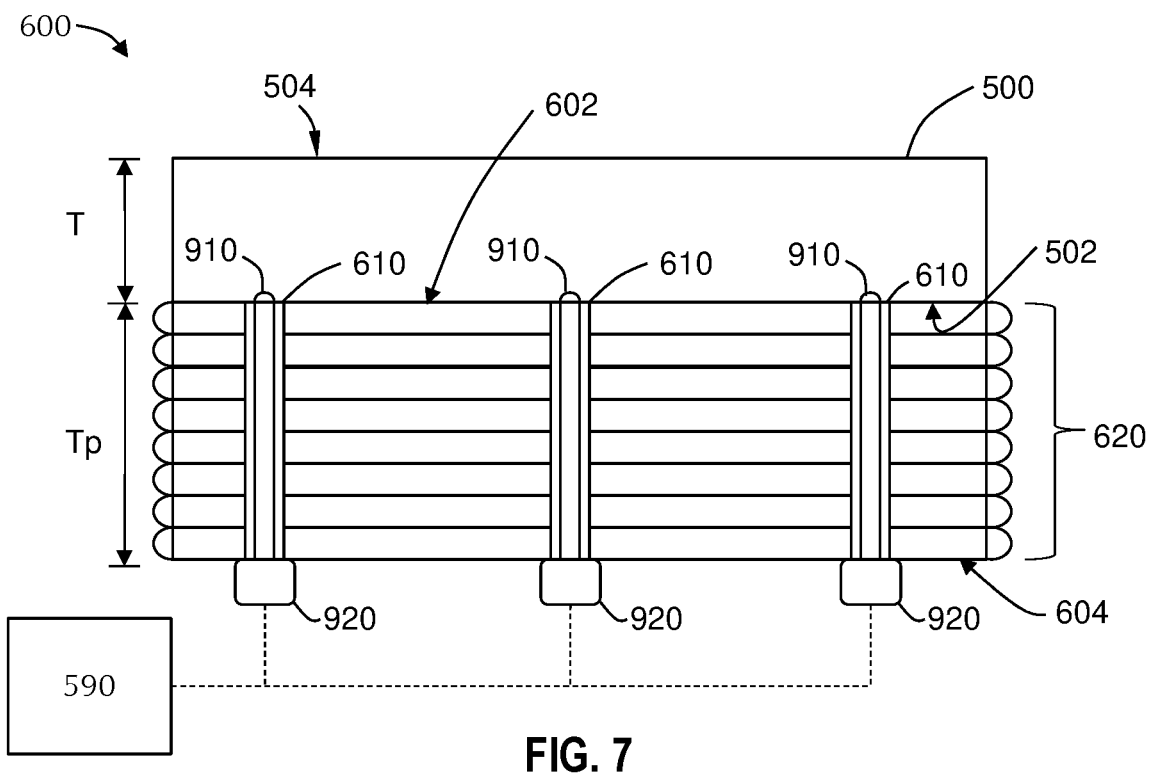
FIG. 7 is a cross-sectional schematic view of a substrate support according to one or more embodiment of the disclosure.

As shown in FIG. 7, the active heat transfer component 600 is comprised of a plurality of conduits. In some embodiments, the plurality of conduits comprise of a plurality of water cooling coils 620 configured as a water cooling block with the plurality of water cooling coils 620 adjacent to one another defining a thickness Tp. The plurality of water cooling coils 620 have a top surface 602 in contact with the bottom surface 502 of the substrate support and a bottom surface 604. Each of the plurality of water cooling coils 620 have an inlet and an outlet (not shown) and each of the inlets and outlets are connected to an adjacent inlet and an adjacent outlet of an adjacent water cooling coil 620. In some embodiments, the plurality of water cooling coils 620 is connected in series forming a loop. In some embodiments, the plurality of water cooling coils 620 is connected in parallel forming a loop. In some embodiments, a water pump is connected to the water cooling coils 620 to propel water or coolant through the loop. The plurality of water cooling coils 620 further include probe openings 610 extending through the water cooling coils 620 and are configured to receive the temperature probes 900.

Each temperature probe 900 comprises a shaft or hollow tube having a probe end 910 and a base 920. Within the shaft or hollow tube is a phosphor ceramic core surrounding a light pipe which connects the probe end 910 to the base 920. In some embodiments, the light pipe is a fiber optic cable. In some embodiments, the light pipe transmits generated by the probe end to the base 920. In some embodiments, the base 920 further comprises a temperature converter at an opposite end of the light pipe from the probe end 910. In some embodiments, the shaft or hollow tube encloses at least one fiber optic cable.

In some embodiments, when the temperature probe 900 is inserted into the probe opening 610, the probe end 910 is in contact with the bottom surface 502 of the substrate support 500 to measure the temperature of the bottom surface 502 of the substrate support 500. In some embodiments, the probe end 910 is capable of measuring the temperature within the processing volume by protruding through a hole of the substrate support 500 and through the thickness T of the substrate support 500. The base 920 includes terminal connections which are connected to a controller 590 for monitoring the temperature within the processing volume. The fiber optic cable transfers temperature data from the probe end 910 to the base 920 without being degraded or damaged by high temperatures existing within the processing chamber.

The plurality of water cooling coils 620 of FIG. 7 actively cool the shaft of the temperature probe 900 by passing water or coolant through the water cooling coils 620, effectuating heat transfer from the shaft of the temperature probe 900 to the water or coolant circulating through the water cooling coils 620.

Figure 8A:
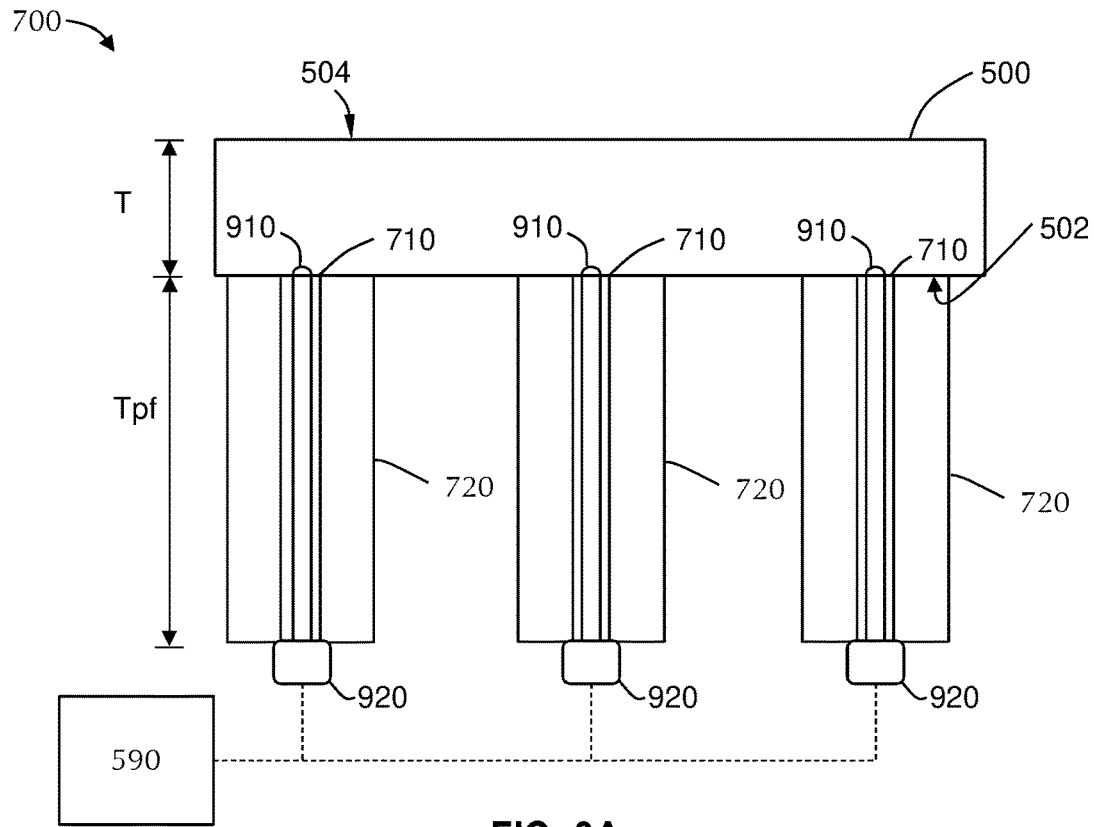
FIG. 8A is a cross-sectional schematic view of a substrate support according to one or more embodiment of the disclosure.
Figure 8B:
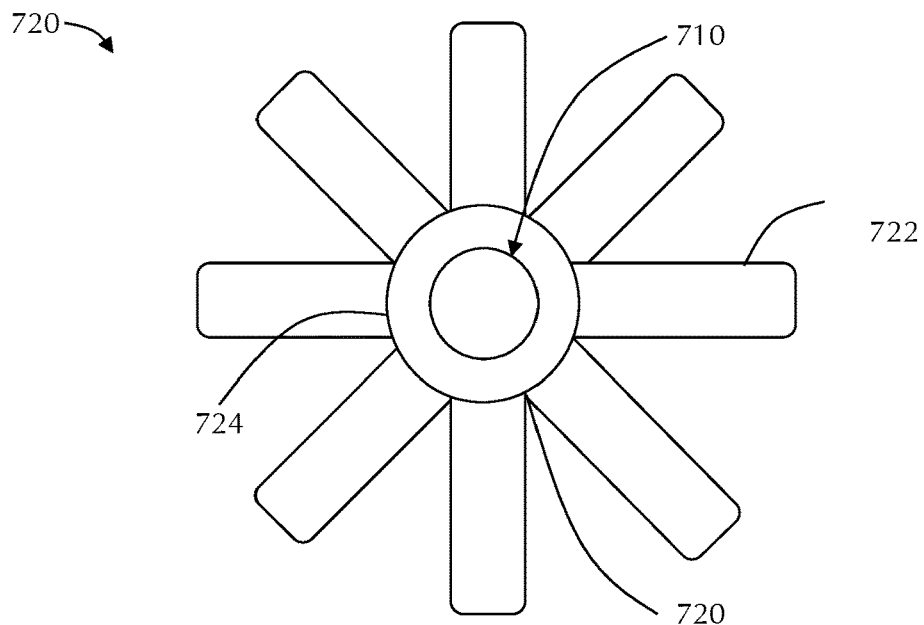
FIG. 8B is a cross-sectional view of a cooling fin according to one or more embodiment of the disclosure.

FIGS. 8A and 8B illustrate an alternative embodiment of a passive heat transfer component 700 which utilizes a plurality of fin stacks 720 for passively cooling the temperature probe 900 by effectuating heat transfer between the plurality of fin stacks 720 and ambient air within a non-vacuum environment. This is advantageous environments which have air flowing through them. Each of the plurality of fin stacks 720 comprises a top surface 702 in contact with the bottom surface 502 of the substrate support and a bottom surface 704 defining a thickness Tpf. The plurality of fin stacks 720 further include probe openings 710 extending through the plurality of fin stacks 720 and are configured to receive the temperature probes 900. As shown in FIG. 8B, each fin stacks 720 comprises a solid core 724 through which the probe opening 710 extends through and a plurality of thin blades 722 creating an increased surface area for passively cooling the fin stacks 720 as air flows past the thin blades 722.

Figure 9A:
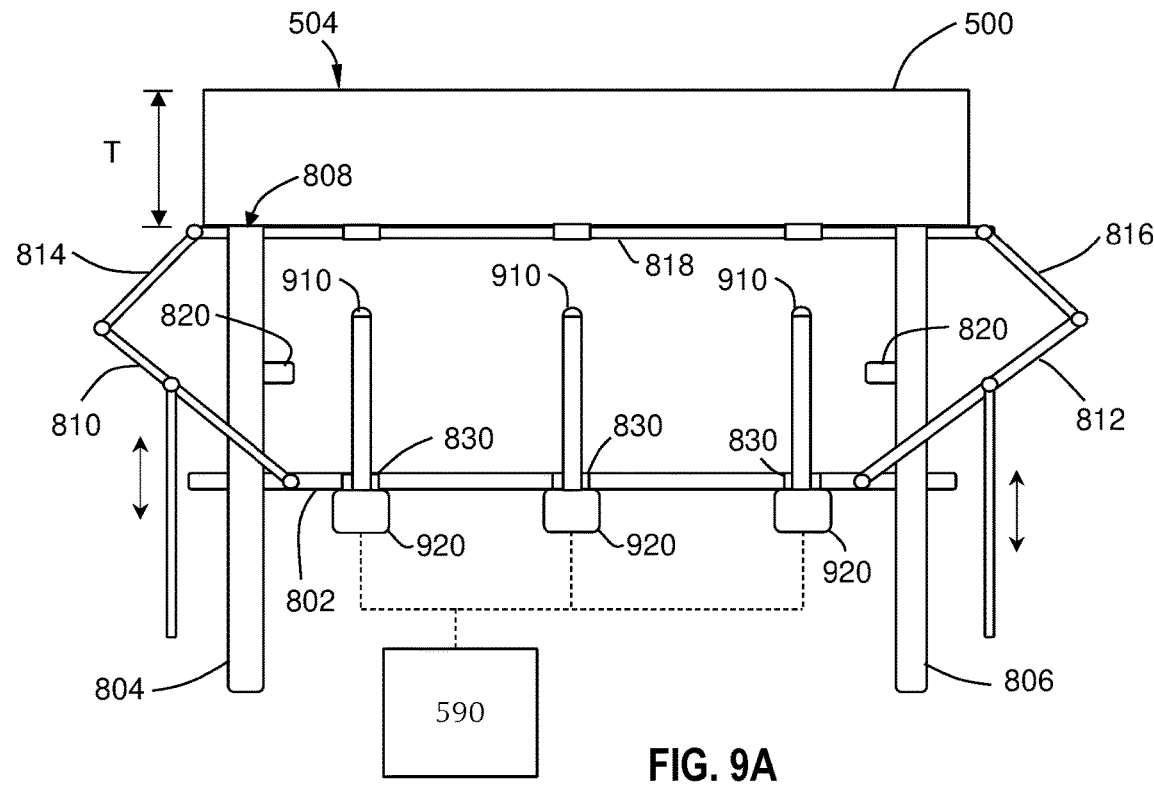
FIG. 9A is a cross-sectional view of a cooling fin in a lowered position according to one or more embodiment of the disclosure; and, FIG. 9B is a cross-sectional view of a cooling fin in an upward position according to one or more embodiment of the disclosure.
Figure 9B:
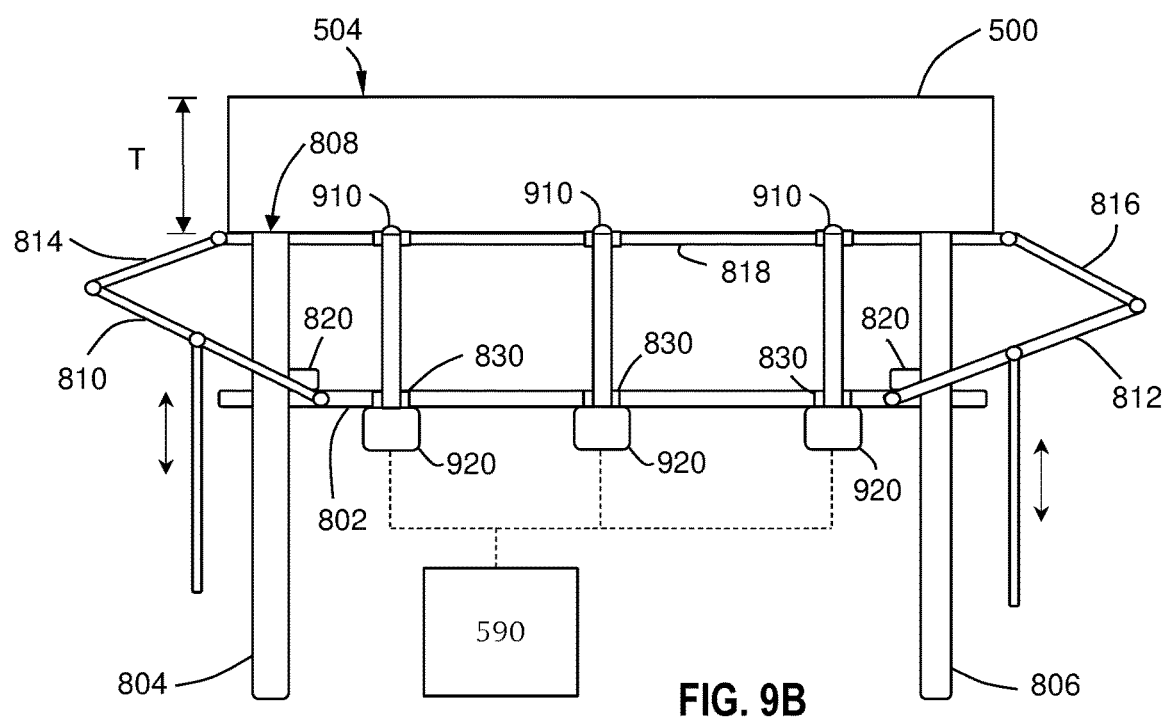

FIGS. 9A and 9B illustrate a sliding assembly 800 having mechanical arms which elevate the temperature probes 900 to an upward position for measuring the temperature of the substrate support 500 and lowering the temperature probes 900 to a lowered position after a temperature reading is taken. FIG. 9A illustrates the sliding assembly 800 in the lowered position and FIG. 9B illustrates the sliding assembly 800 in the upward position. The sliding assembly 800 advances the temperature probes 900 in an upward direction towards the support assembly 200 or in a downward direction away from the support assembly 200. The sliding assembly 800 has a base 802 comprising probe openings 830 which extend through the thickness of the base 802 The temperature probes 900 extend from the base 802 such that when fully advanced as shown in FIG. 9B, the probe ends 910 come into contact with the substrate support 500. Thus, the temperature probes 900 can be raised to the support surface 500 to take a measurement of temperature and subsequently lowered from the substrate support 500 after taking a measurement of temperature, thus limiting heat exposure to the temperature probes 900.

The base 802 slides on rails (804, 806) in an upward or downward direction. Each of the rails (804, 806) has a top surface 808 which is in contact with the bottom surface 502 of the substrate support 500. The base 802 is connected to a first link and a second link (810, 812) and each of the two first link and second link (810, 812) are connected to a first armature and a second armature (814, 816). The armatures (814, 816) are connected to a top base 818 which is in contact with the bottom surface 502 of the substrate support 500. Stoppers 820 positioned on the rails (804, 806) are configured to limit motion of the base 802 as the base 802 advances upward along the rails (804, 806). Control arms (822, 824) are connected to the first link and second link (810, 812) about a pivot point along the length of the first link and second link (810, 812) such that, as shown in FIGS. 9A and 9B, advancement of the control arms (822, 824) in an upward direction advances the base 802 toward the substrate support 500.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A substrate support comprising:
    a support top having a support surface and a bottom surface defining a thickness of the support body, and a thermal element within the thickness of the support body;
    a support bottom having a top surface and a bottom surface defining a thickness of the support bottom, the top surface positioned adjacent the bottom surface of the support top, and at least one opening extending through the thickness of the support bottom, the at least one opening configured to accept a temperature probe; and
    an active heat transfer component comprising at least one conduit extending around an outer surface of the support bottom, the at least one conduit having an inlet end and an outlet end and configured to provide a flow of heat transfer fluid.

2. The substrate support of claim 1, further comprising at least one temperature probe positioned within the opening in the support bottom, the temperature probe having a phosphor tip contacting the bottom surface of the support top, a light pipe connected to the phosphor tip and extending at least partially through the support bottom to a probe contact.

3. The substrate support of claim 2, wherein the light pipe of the temperature probe transmits light generated by the phosphor tip to a temperature converter at an opposite end of the light pipe from the phosphor tip.

4. The substrate support of claim 3, wherein the light pipe comprises a hollow tube enclosing at least one fiber optic cable.

5. A substrate support comprising:
    a support top having a support surface and a bottom surface defining a thickness of the support body, and a thermal element within the thickness of the support body;
    a support bottom having a top surface and a bottom surface defining a thickness of the support bottom, the top surface positioned adjacent the bottom surface of the support top, and at least one opening extending through the thickness of the support bottom, the at least one opening configured to accept a temperature probe; and
    a passive heat transfer component comprising at least one heat transfer fin extending along the at least one opening in the support bottom, the passive heat transfer component having a channel to allow the temperature probe to pass through the support bottom.

6. The substrate support of claim 5 wherein the passive heat transfer component is a fin stack for passively cooling the temperature probe by effectuating heat transfer between the plurality of fin stacks and ambient air within a non-vacuum environment.

7. The substrate support of claim 5 wherein each fin stacks comprises a solid core through which the opening extends through and a plurality of thin blades creating an increased surface area for passively cooling the fin stacks as air flows past the thin blades.

8. A substrate support comprising:
    a support top having a support surface and a bottom surface defining a thickness of the support body, and a thermal element within the thickness of the support body;
    a support bottom having a top surface and a bottom surface defining a thickness of the support bottom, the top surface positioned adjacent the bottom surface of the support top, and at least one opening extending through the thickness of the support bottom, the at least one opening configured to accept a temperature probe; and
    a sliding assembly comprising a base which slides rails in an upward or downward direction and a plurality of temperature probe protruding from the base.

9. The substrate support of claim 8 further comprising:
    a first link and a second link connected to the base;
    a first armature and a second armature connected to the top base; and,
    a top base in contact with the bottom surface of the substrate support.

10. The substrate support of claim 9 further comprising control arms connected to the first and second links about a pivot point along a length of the first link and second link such that advancement of the control arms in an upward direction advances the base toward the substrate support.

* * * * *